(12) United States Patent
Bong et al.

(10) Patent No.: US 12,016,245 B2
(45) Date of Patent: Jun. 18, 2024

(54) POWER GENERATION APPARATUS

(71) Applicant: LG INNOTEK CO., LTD., Seoul (KR)

(72) Inventors: Sang Hoon Bong, Seoul (KR); Un Hak Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 57 days.

(21) Appl. No.: 17/928,666

(22) PCT Filed: Jun. 8, 2021

(86) PCT No.: PCT/KR2021/007136
§ 371 (c)(1),
(2) Date: Nov. 30, 2022

(87) PCT Pub. No.: WO2021/251721
PCT Pub. Date: Dec. 16, 2021

(65) Prior Publication Data
US 2023/0189649 A1 Jun. 15, 2023

(30) Foreign Application Priority Data

Jun. 12, 2020 (KR) ........................ 10-2020-0071400

(51) Int. Cl.
*H10N 10/17* (2023.01)
*H10N 10/01* (2023.01)

(52) U.S. Cl.
CPC ............. *H10N 10/17* (2023.02); *H10N 10/01* (2023.02)

(58) Field of Classification Search
CPC ........ H10N 10/17; H10N 10/01; F25B 21/02; H01L 23/38
See application file for complete search history.

(56) References Cited

U.S. PATENT DOCUMENTS

| 6,345,507 B1 | 2/2002 | Gillen |
| 2014/0230872 A1 | 8/2014 | Makino et al. |

(Continued)

FOREIGN PATENT DOCUMENTS

| EP | 2723144 | 10/2020 |
| KR | 10-2010-0120339 | 11/2010 |

(Continued)

OTHER PUBLICATIONS

European Search Report dated Oct. 10, 2023 issued in Application No. 21822152.1.

(Continued)

*Primary Examiner* — Devina Pillay
(74) *Attorney, Agent, or Firm* — KED & ASSOCIATES, LLP

(57) ABSTRACT

A power generation apparatus according to the present invention comprises: a thermoelectric conversion part including a duct and multiple thermoelectric modules arranged on a surface of the duct; a chamber having a hole formed through a lateral surface thereof to allow the thermoelectric conversion part to be inserted therethrough; a wire connected to the multiple thermoelectric modules; and a guide member having a reception space formed therein for receiving the wire, wherein the guide member comprises: a case disposed adjacent to the side surface of the chamber and including a through-hole and a wire hole through which the wire passes; a pipe disposed outside the reception space of the case to correspond to the through-hole; a molding member disposed in the reception space; and a cover disposed at the upper end of the case, and the molding member is disposed to surround the wire.

20 Claims, 15 Drawing Sheets

(56) References Cited

U.S. PATENT DOCUMENTS

| | | | |
|---|---|---|---|
| 2015/0116943 A1* | 4/2015 | Olsson | H05K 7/20418 361/708 |
| 2015/0243866 A1 | 8/2015 | Iriyama | |
| 2017/0345988 A1 | 11/2017 | Kim et al. | |
| 2020/0266327 A1* | 8/2020 | Jovovic | H10N 10/01 |

FOREIGN PATENT DOCUMENTS

| KR | 10-2014-0051417 | 4/2014 |
|---|---|---|
| KR | 10-2019-0065763 | 6/2019 |
| KR | 10-2020-0049086 | 5/2020 |
| KR | 20-0491760 | 6/2020 |

OTHER PUBLICATIONS

International Search Report dated Aug. 5, 2021 issued in Application No. PCT/KR2021/007136.
Korean Office Action dated Mar. 14, 2024 issued in Application No. 10-2020-0071400.

* cited by examiner

[FIG. 1]
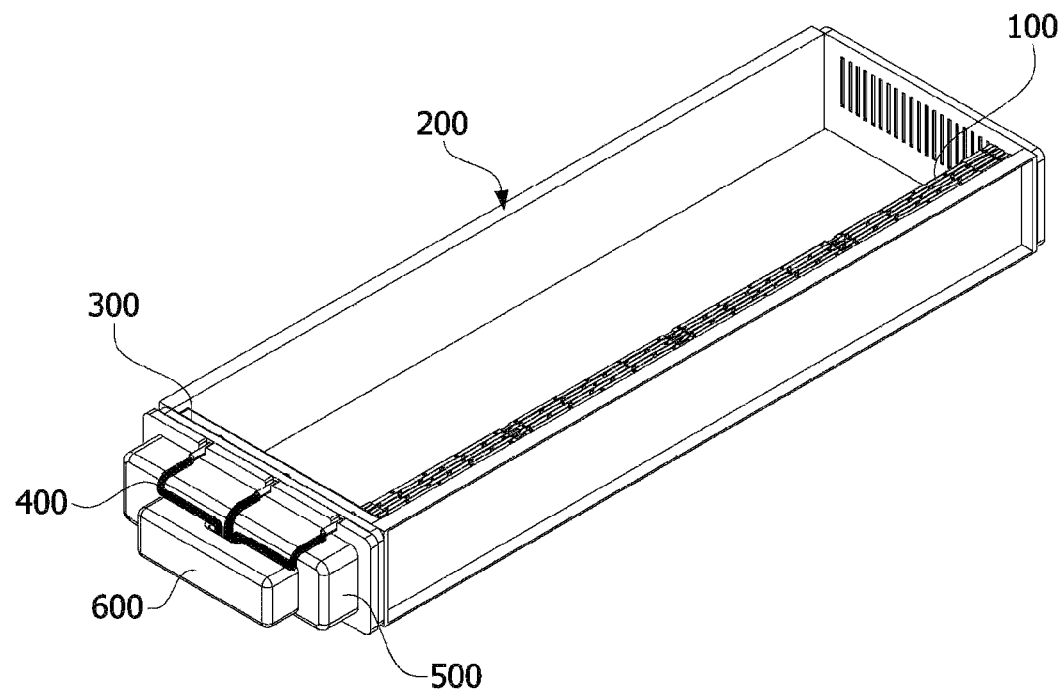

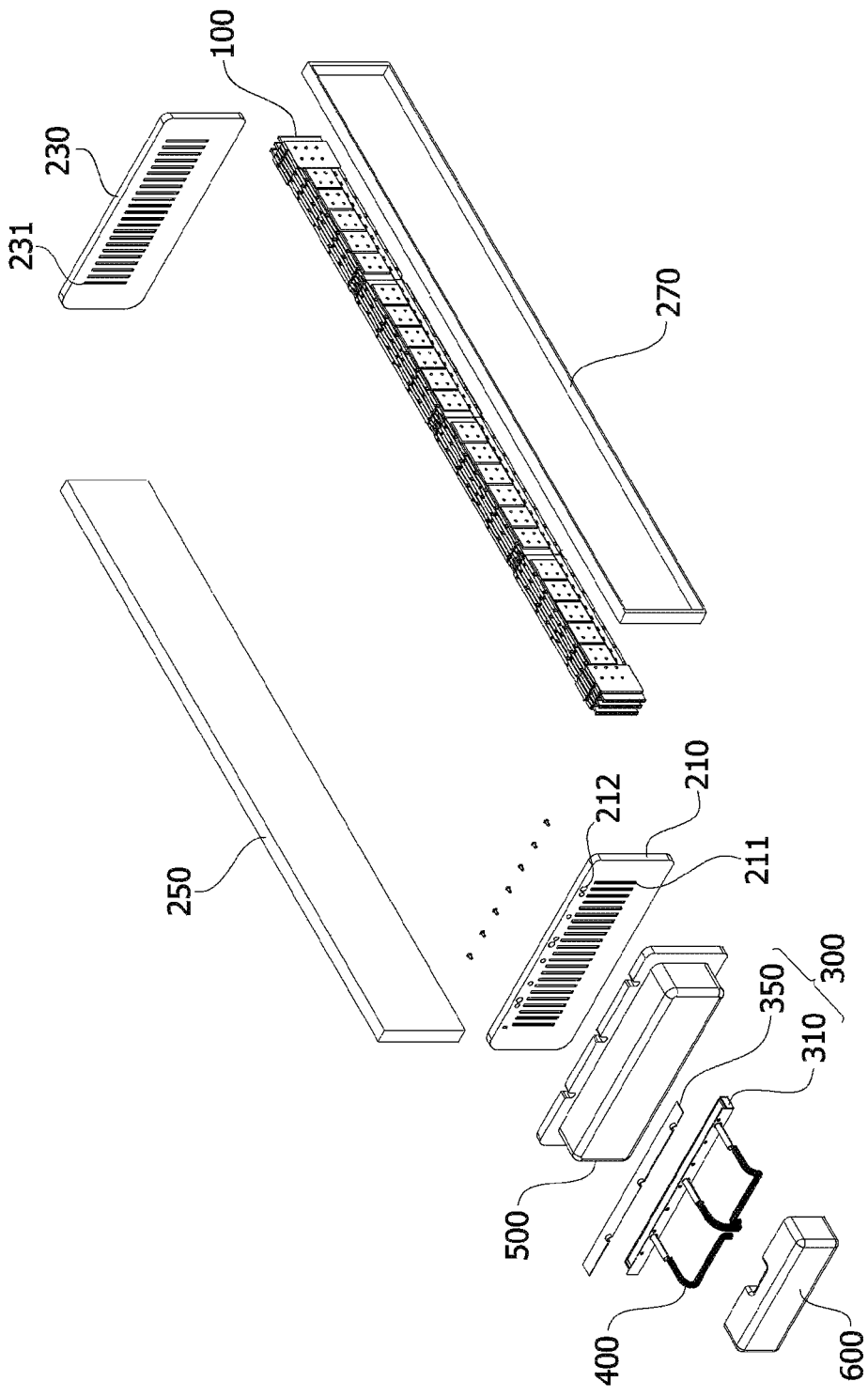

[FIG. 3]
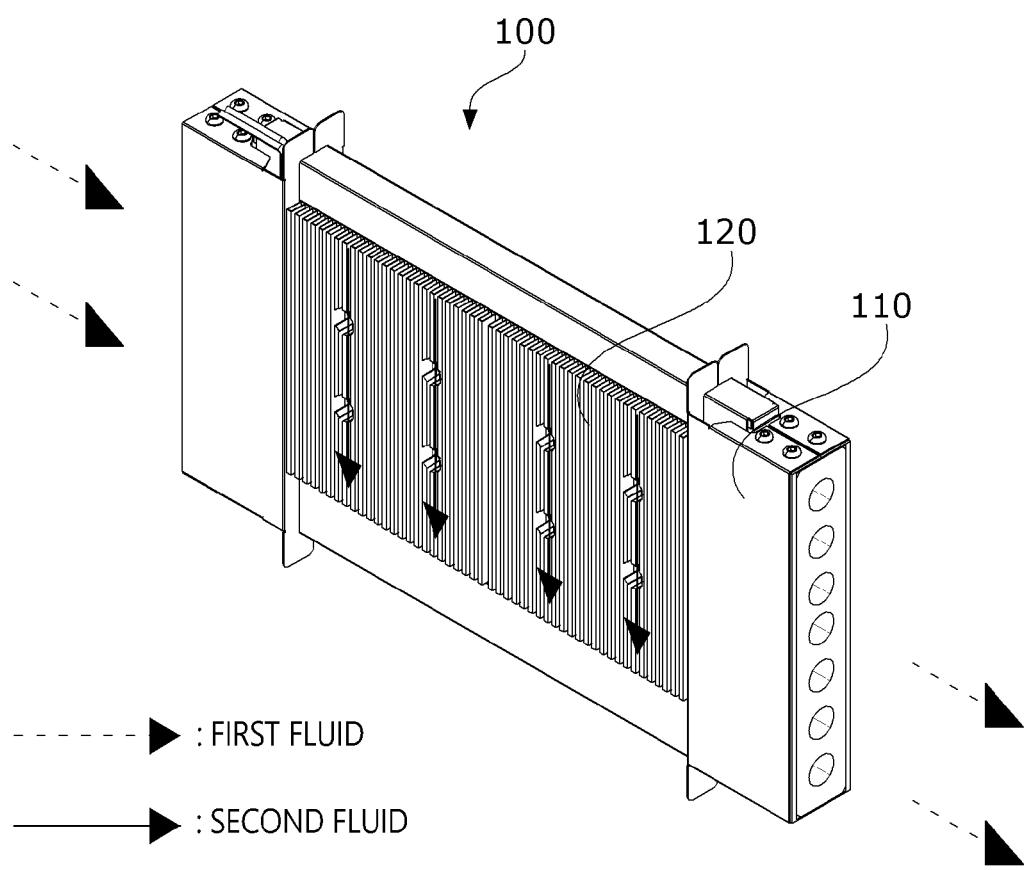

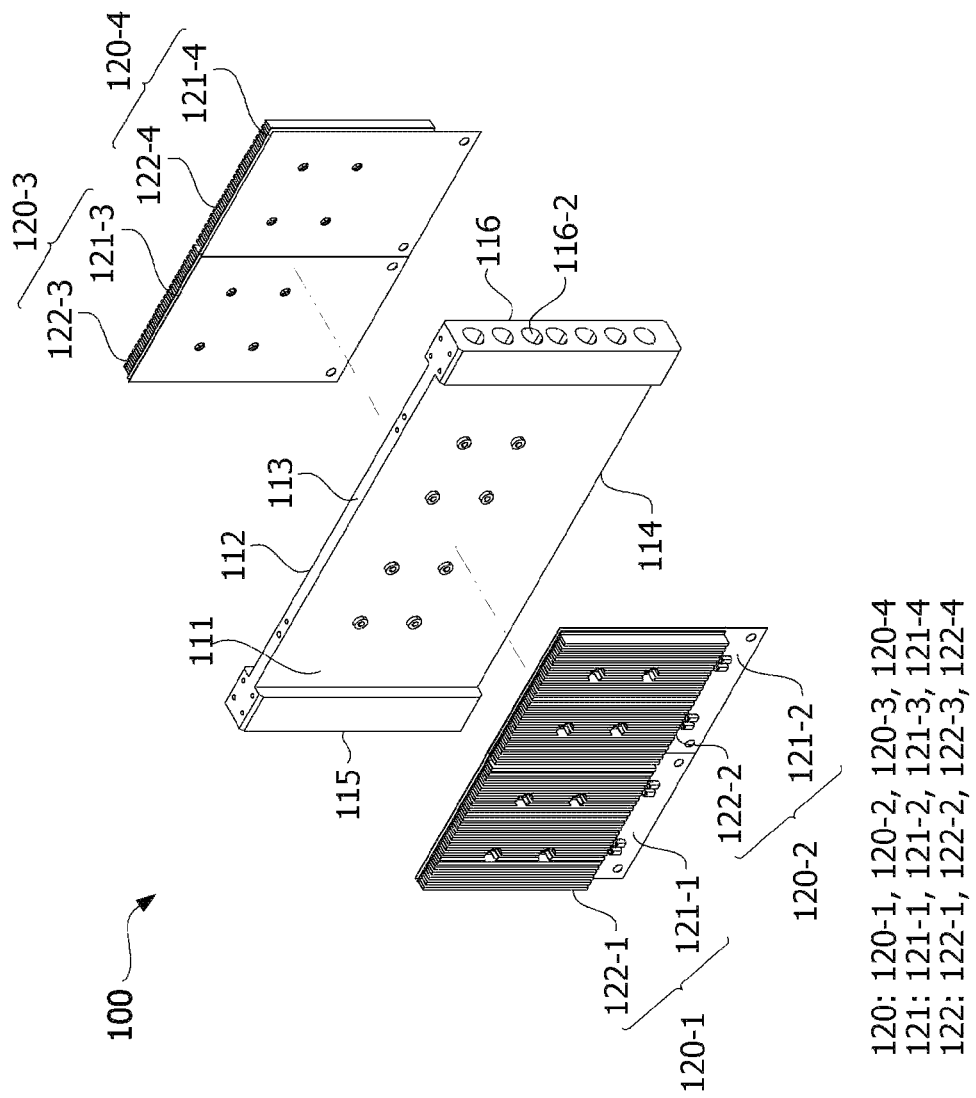

[FIG. 5]
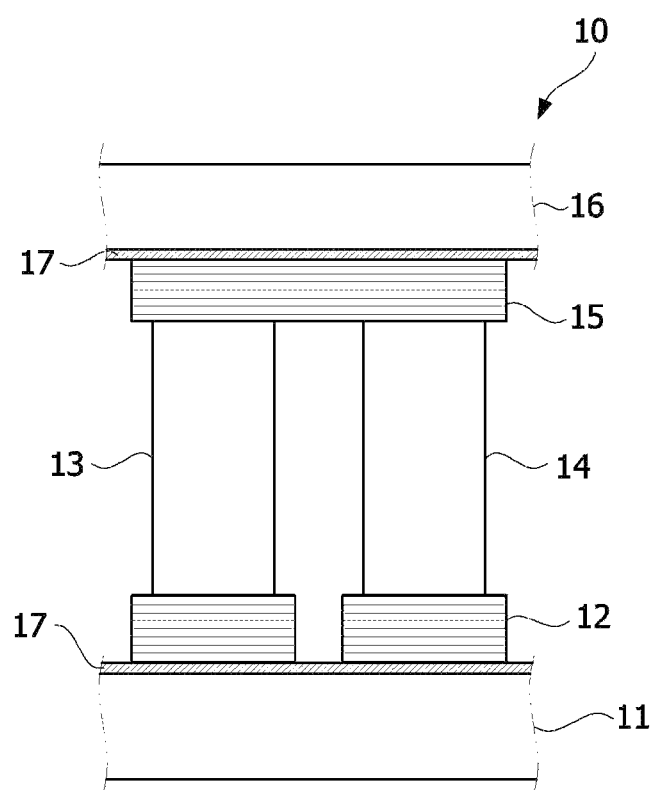

[FIG. 6]
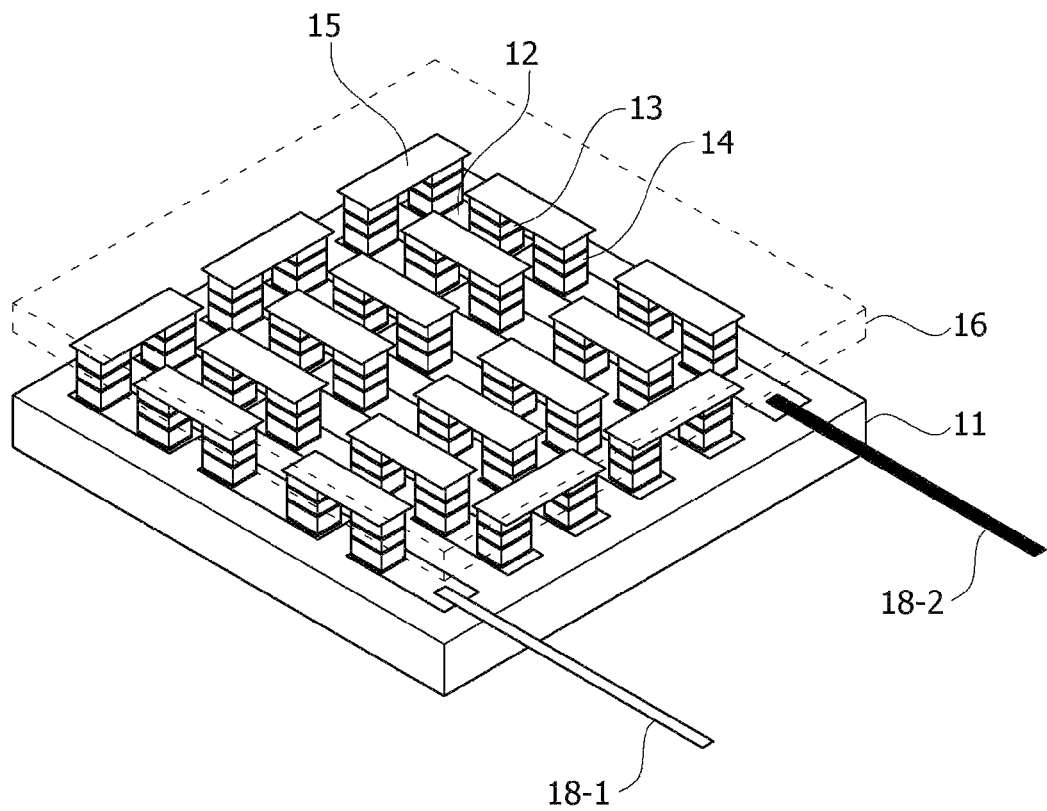

[FIG. 7]
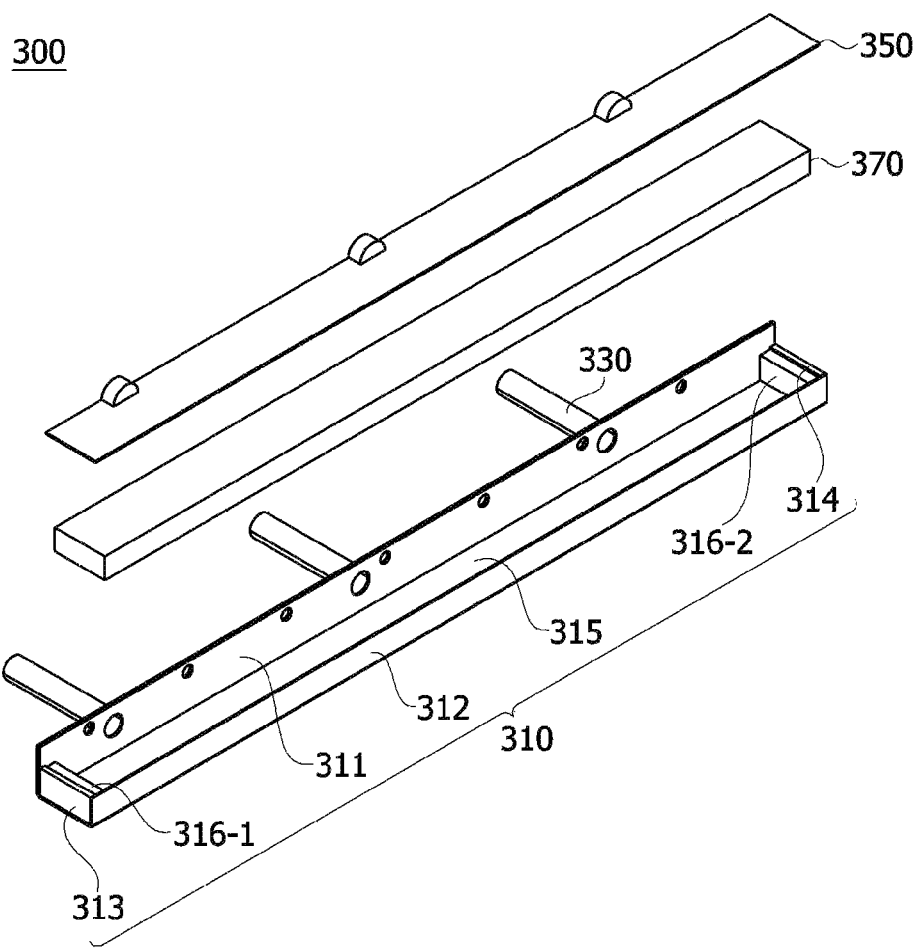
[FIG. 8]
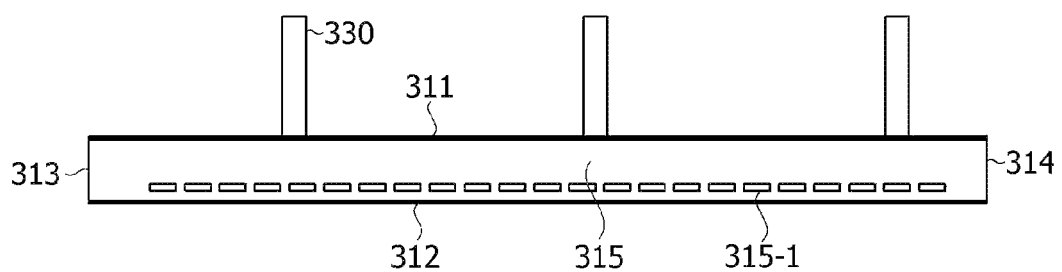

[FIG. 9]
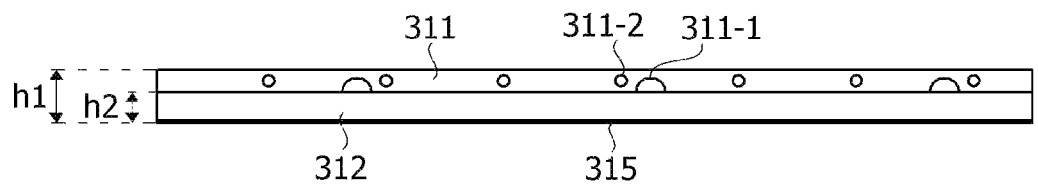
[FIG. 10]
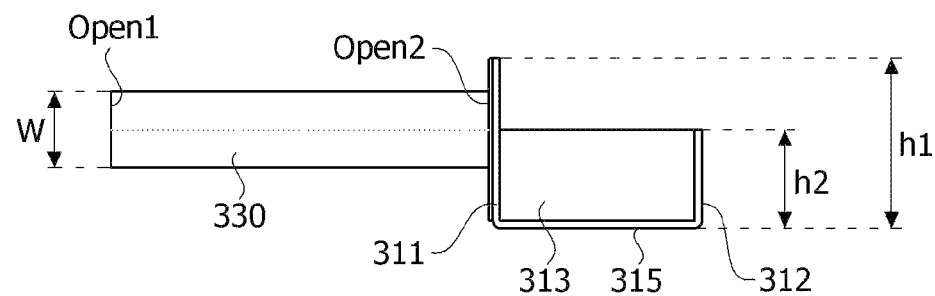
[FIG. 11]
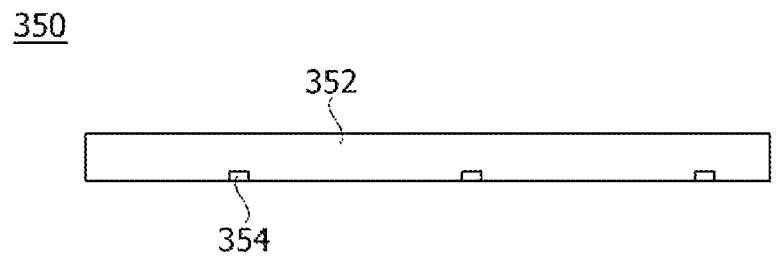
[FIG. 12]

[FIG. 13]
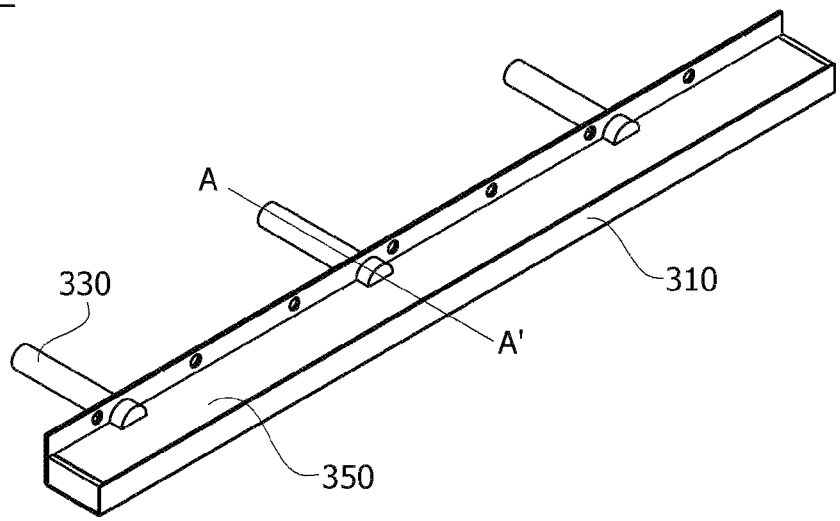
[FIG. 14]
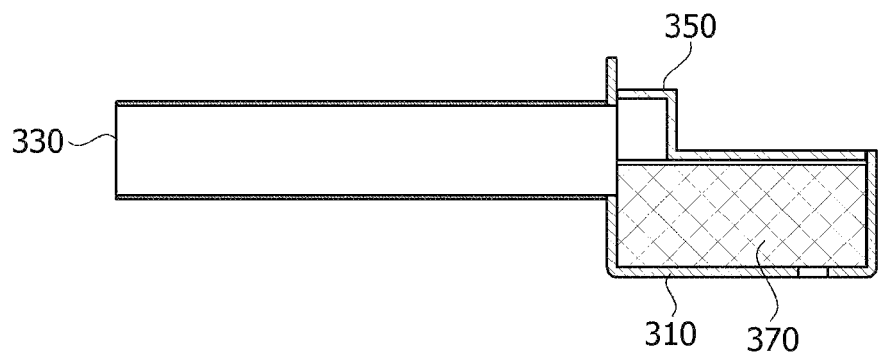

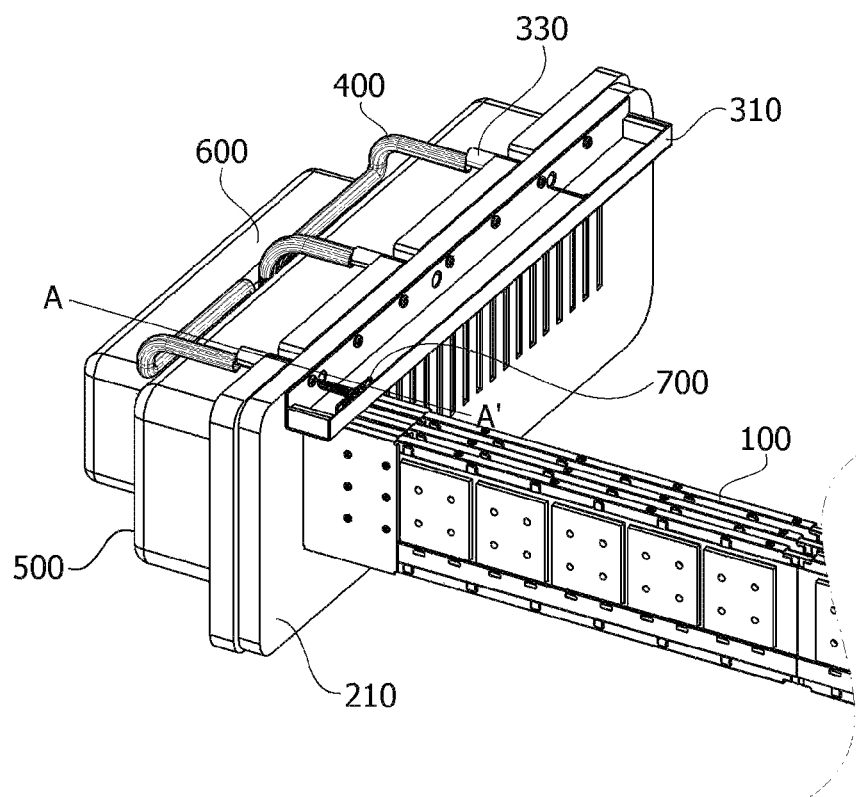
[FIG. 15]

[FIG. 16]
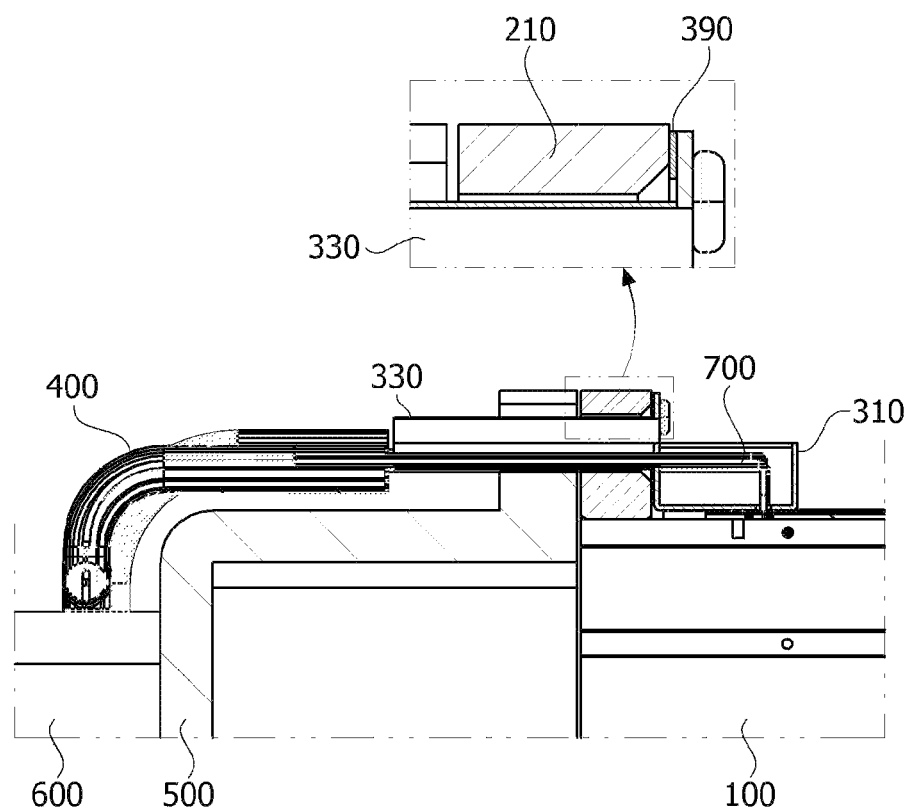

[FIG. 17]
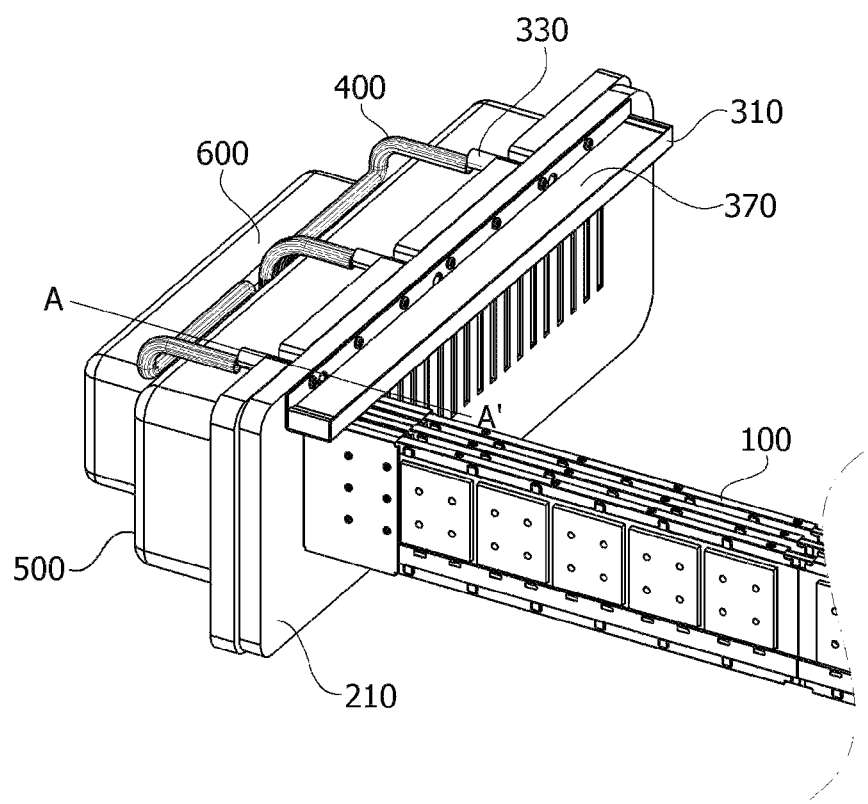

[FIG. 18]
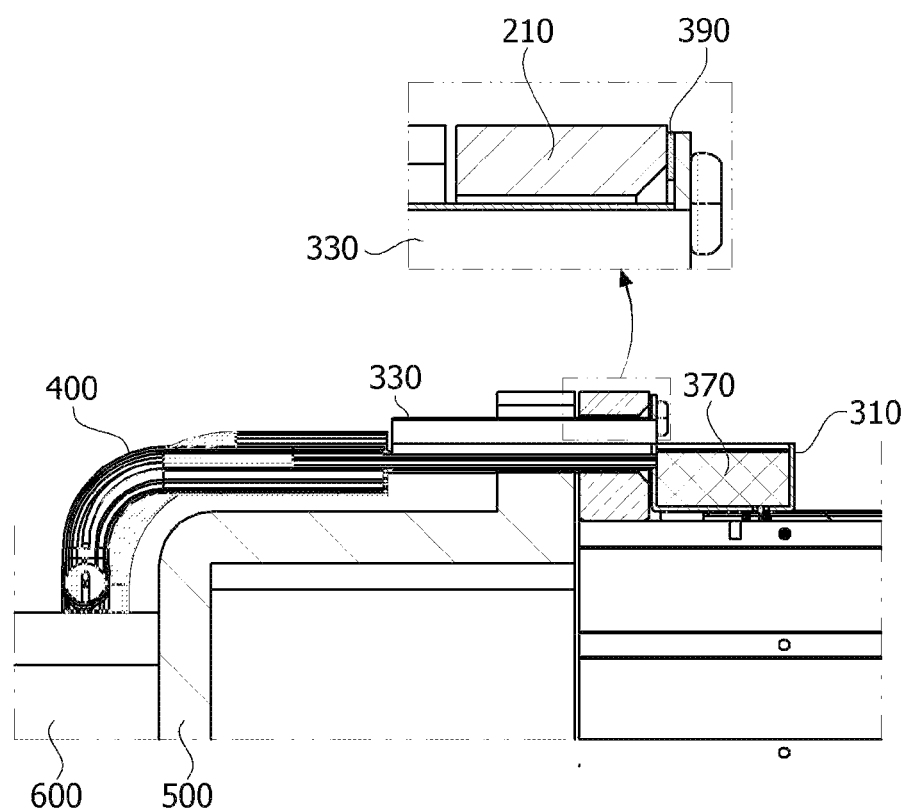

[FIG. 19]
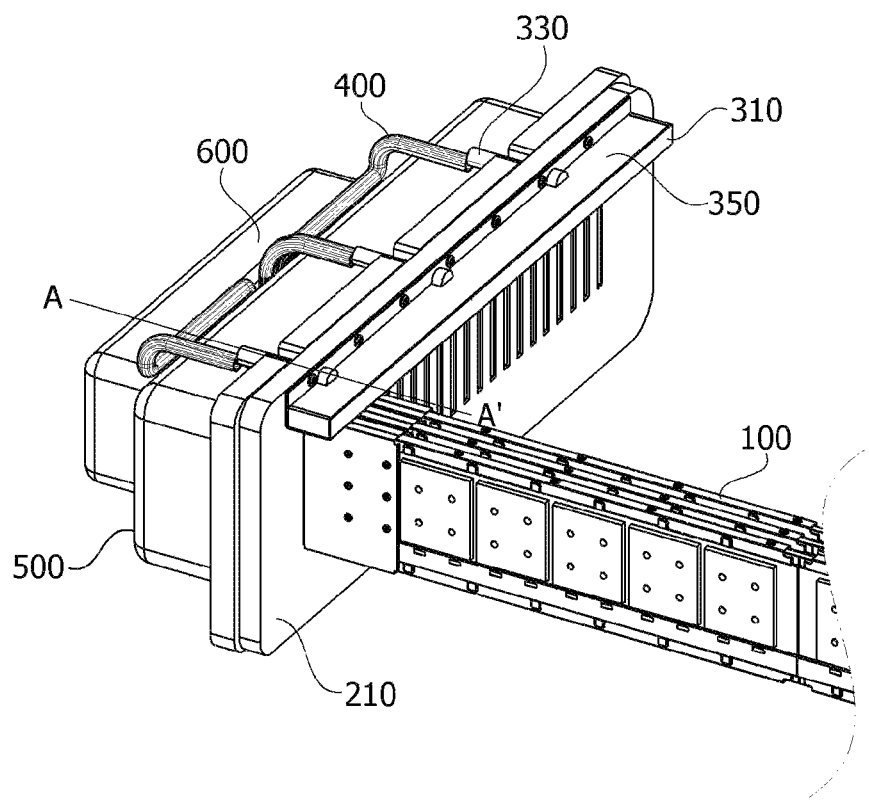

[FIG. 20]
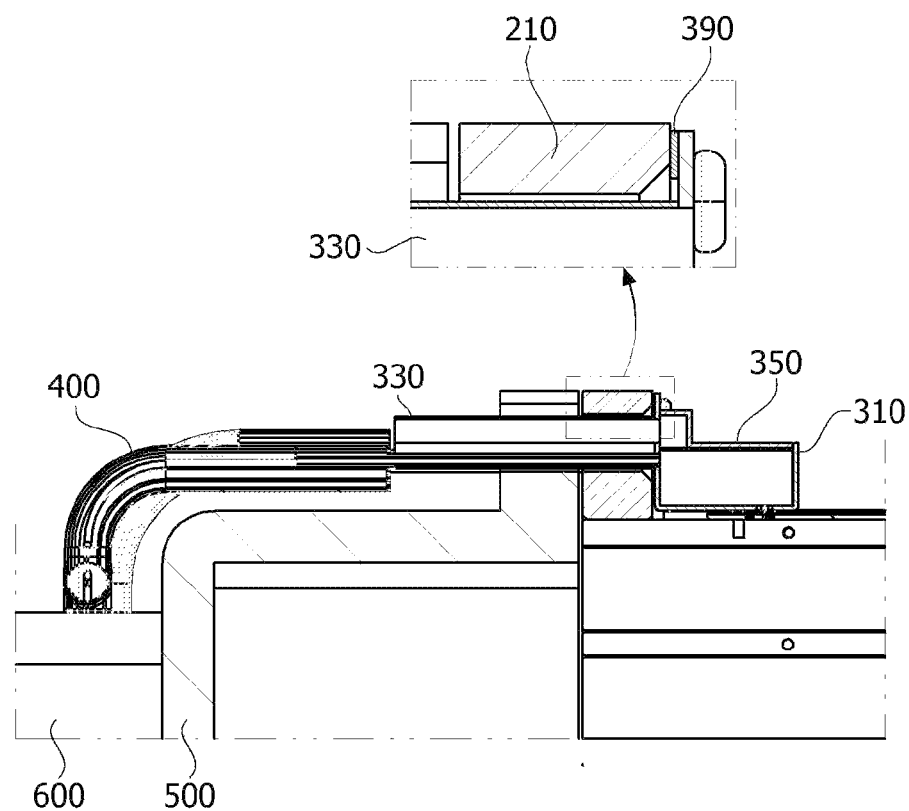

POWER GENERATION APPARATUS

CROSS-REFERENCE TO RELATED PATENT APPLICATIONS

This application is a U.S. National Stage Application under 35 U.S.C. § 371 of PCT Application No. PCT/KR2021/007136, filed Jun. 8, 2021, which claims priority to Korean Patent Application No. 10-2020-0071400, filed Jun. 12, 2020, whose entire disclosures are hereby incorporated by reference.

TECHNICAL FIELD

The present invention relates to a power generation apparatus, and more specifically, to a power generation apparatus which generates power using a difference in temperature between a lower-temperature part and a high-temperature part of a thermoelectric element.

BACKGROUND ART

A thermoelectric effect is a direct energy conversion phenomenon between heat and electricity generated due to the movement of electrons and holes in a material.

A thermoelectric element is generally referred to as an element using a thermoelectric effect and has a structure in which P-type thermoelectric materials and N-type thermoelectric materials are disposed between and bonded to metal electrodes to form PN junction pairs.

Thermoelectric elements may be divided into elements using a change in electrical resistance depending on a change in temperature, elements using the Seebeck effect in which an electromotive force is generated due to a difference in temperature, elements using the Peltier effect in which heat absorption or heating occurs due to a current, and the like.

Thermoelectric elements have been variously applied to home appliances, electronic components, communication components, and the like. As an example, thermoelectric elements may be applied to cooling apparatuses, heating apparatuses, power generation apparatuses, and the like. Therefore, the demand for the thermoelectric performance of the thermoelectric element is gradually increasing.

Recently, there are needs to generate power using waste heat generated at high temperature by engines of vehicles, vessels, and the like and thermoelectric elements. In this case, a fluid flow part through which a first fluid flows may be disposed at a side of a lower-temperature part of a thermoelectric element, and a heatsink may be disposed at a side of a high-temperature part of the thermoelectric element, and a second fluid may pass the heatsink. Accordingly, electricity can be generated due to a difference in temperature between the lower-temperature part and the high-temperature part of the thermoelectric element, and the power generation performance may vary according to a structure of a power generation apparatus.

DISCLOSURE

Technical Problem

The present invention is directed to providing a power generation apparatus which generates power using a difference in temperature between a lower-temperature part and a high-temperature part of a thermoelectric element.

Technical Solution

One aspect of the present invention provides a power generation apparatus including a thermoelectric conversion part including a duct and a plurality of thermoelectric modules disposed on one surface of the duct, a chamber having one side surface in which a hole is formed so that the thermoelectric conversion part is inserted into the hole, a wire connected to the plurality of thermoelectric modules, and a guide member in which an accommodation space is formed to accommodate the wire, wherein the guide member includes a case disposed close to the one side surface of the chamber and including a wire hole and a through-hole through which the wire passes, a pipe disposed outside the accommodation space of the case to correspond to the through-hole, a molding member disposed in the accommodation space, and a cover disposed on upper end of the case, and the molding member is disposed to surround the wire.

The wire may be withdrawn from the thermoelectric conversion part and disposed to pass through the wire hole, the through-hole, and the pipe.

The case may include a bottom plate, a first sidewall disposed on a first edge of the bottom plate, and a second sidewall which is opposite to the first sidewall and disposed on a second edge opposite to the first edge of the bottom plate, wherein the wire hole may be disposed in the bottom plate, and the through-hole may be disposed in the first sidewall.

The first sidewall may be disposed close to the one side surface of the chamber, and the bottom plate may be disposed close to an upper surface of the thermoelectric conversion part.

The molding member may be disposed in a separation space between the wire and the wire hole.

A height of the molding member may be less than or equal to a height of the second sidewall.

The power generation apparatus may further include a gasket disposed between the one side surface of the chamber and the first sidewall of the case.

The cover may include a main body and a protruding part disposed at one side of the main body, wherein the protruding part may be disposed to correspond to the through-hole disposed in the first sidewall.

The power generation apparatus may further include a wire tube which is disposed close to the pipe and in which the wire passing through the pipe is disposed therein.

A plurality of electric wires withdrawn from thermoelectric conversion parts of which the number is predetermined may be disposed in the wire tube.

In the chamber, a hole into which the thermoelectric conversion part inserted may be further formed in the other side surface opposite to the one side surface.

Advantageous Effects

According to embodiments of the present invention, a power generation apparatus with a superior seal force can be obtained.

According to embodiments of the present invention, an electric wire which electrically connects a thermoelectric module and a junction box can be protected.

According to embodiments of the present invention, ease of the assembly of the power generation apparatus can be improved.

DESCRIPTION OF DRAWINGS

FIG. 1 is a perspective view illustrating a power generation apparatus according to an embodiment of the present invention.

FIG. 2 is an exploded perspective view illustrating the power generation apparatus according to the embodiment of the present invention.

FIG. 3 is a perspective view illustrating a thermoelectric conversion part according to one embodiment of the present invention.

FIG. 4 is an exploded perspective view illustrating the thermoelectric conversion part according to one embodiment of the present invention.

FIG. 5 is a conceptual view illustrating a thermoelectric element according to one embodiment of the present invention.

FIG. 6 is a conceptual view illustrating a layout of the thermoelectric element according to one embodiment of the present invention.

FIG. 7 is an exploded perspective view illustrating a guide member according to the embodiment of the present invention.

FIG. 8 is a plan view illustrating a case and a pipe according to the embodiment of the present invention.

FIG. 9 is a rear view illustrating the case and the pipe according to the embodiment of the present invention.

FIG. 10 is a side view illustrating the case and the pipe according to the embodiment of the present invention.

FIG. 11 is a plan view illustrating a cover according to the embodiment of the present invention.

FIG. 12 is a front view illustrating the cover according to the embodiment of the present invention.

FIG. 13 is a perspective view illustrating an assembled guide member according to the embodiment of the present invention.

FIG. 14 is a cross-sectional view illustrating the guide member according to the embodiment of the present invention.

FIG. 15 is a perspective view illustrating a power generation module including a case and a pipe according to an embodiment of the present invention.

FIG. 16 is a cross-sectional view illustrating the power generation module including the case and the pipe according to the embodiment of the present invention.

FIG. 17 is a perspective view illustrating a power generation module including a case and a molding member according to an embodiment of the present invention.

FIG. 18 is a cross-sectional view illustrating the power generation module including the case and the molding member according to the embodiment of the present invention.

FIG. 19 is a perspective view illustrating a power generation module including a case, a pipe, a molding member, and a cover according to an embodiment of the present invention.

FIG. 20 is a cross-sectional view illustrating the power generation module including the case, the pipe, the molding member, and the cover according to the embodiment of the present invention.

MODES OF THE INVENTION

Hereinafter, exemplary embodiments of the present invention will be described in detail with reference to the accompanying drawings.

However, the technical spirit of the present invention is not limited to some embodiments which will be described and may be implemented using various other embodiments, and at least one component of the embodiments may be selectively coupled, substituted, and used within the range of the technical spirit of the present invention.

In addition, unless clearly and specifically defined otherwise by context, all terms (including technical and scientific terms) used herein can be interpreted as having meanings customarily understood by those skilled in the art, and meanings of generally used terms, such as those defined in commonly used dictionaries, will be interpreted by considering contextual meanings of the related technology.

In addition, the terms used in the embodiments of the present invention are considered in a descriptive sense and not for limiting the present invention.

In the present specification, unless specifically indicated otherwise by the context, singular forms may include the plural forms thereof, and in a case in which "at least one (or one or more) among A, B, and C" is described, this may include at least one combination among all possible combinations of A, B, and C.

In addition, in descriptions of components of the present invention, terms such as "first," "second," "A," "B," "(a)," and "(b)" can be used.

The terms are only to distinguish one element from another element, and an essence, order, and the like of the element are not limited by the terms.

In addition, when an element is referred to as being "connected" or "coupled" to another element, such a description may include not only a case in which the element is directly connected or coupled to another element but also a case in which the element is connected or coupled to another element with still another element disposed therebetween.

In addition, in a case in which any one element is described as being formed or disposed "on" or "under" another element, such a description includes not only a case in which the two elements are formed or disposed in direct contact with each other but also a case in which one or more other elements are formed or disposed between the two elements. In addition, when one element is described as being disposed "on or under" another element, such a description may include a case in which the one element is disposed at an upper side or lower side with respect to another element.

FIG. 1 is a perspective view illustrating a power generation apparatus according to an embodiment of the present invention. FIG. 2 is an exploded perspective view illustrating the power generation apparatus according to the embodiment of the present invention.

Referring to FIGS. 1 and 2, the power generation apparatus according to the embodiment of the present invention may include a thermoelectric conversion part 100, a chamber 200, a guide member 300, a wire tube 400, a channel cover 500, and a junction box 600.

The thermoelectric conversion part 100 may be disposed in the chamber 200. The thermoelectric conversion part 100 may be provided as a plurality of thermoelectric conversion parts 100, and the plurality of thermoelectric conversion parts 100 may be disposed in the chamber 200. A part of the thermoelectric conversion part 100 may be inserted into a hole of the chamber 200 so that the thermoelectric conversion part 100 may be coupled to the chamber 200. A welding member may be disposed between the part of the thermoelectric conversion part 100 inserted into the hole of the chamber 200 and the chamber 200. The thermoelectric conversion part 100 may be fixed to the chamber 200 by the welding member, and an inner portion of the chamber 200 may be blocked from an outer portion of the chamber 200 by sealing using the welding member.

The thermoelectric conversion part 100 may include a duct and a plurality of thermoelectric modules. The duct may include a fluid inlet, a fluid outlet, and a fluid passage pipe. The fluid inlet may be provided as a plurality of fluid inlets, the fluid outlet may be provided as a plurality of fluid outlets, and the fluid passage pipe may be provided as a plurality of fluid passage pipes. The fluid inlet may be disposed on at least one surface of the duct, and the fluid outlet may be disposed on at least one surface of the duct. The fluid inlet and the fluid outlet may communicate with the fluid passage pipe. The plurality of thermoelectric modules may be disposed on at least one surface of the duct. The plurality of thermoelectric modules may be disposed on at least one surface of a first surface and a second surface opposite to the first surface of the duct. The thermoelectric modules may include a plurality of thermoelectric elements disposed on a substrate. The plurality of thermoelectric modules may be electrically connected to each other. The plurality of thermoelectric modules may be electrically connected by a wire.

The chamber 200 may include a plurality of plates. The chamber 200 may include an inner space formed by the plurality of plates. The thermoelectric conversion part 100 may be disposed in the inner space of the chamber 200.

The plate may be provided as the plurality of plates. The plates may include a first plate 210 and a second plate 230. The first plate 210 and the second plate 230 may be disposed to face each other. The first plate 210 may be disposed to be spaced a predetermined distance from the second plate 230. A separation distance between the first plate 210 and the second plate 230 may be smaller than a total length of the thermoelectric conversion part 100.

The first plate 210 and the second plate 230 may include holes. The plates may include first holes 211 and 231 into which the thermoelectric conversion part 100 is inserted. The first holes 211 formed in the first plate 210 and the first holes 231 formed in the second plate 230 may be disposed to face each other. The number of first holes 211 formed in the first plate 210 and the number of first holes 231 formed in the second plate 230 may be the same. One end of the thermoelectric conversion part 100 may be inserted into the holes formed in the first plate 210, and the other end of the thermoelectric conversion part 100 may be inserted into the holes formed in the second plate 230 disposed to face the holes formed in the first plate 210.

The plates may include a third plate 250 and a fourth plate 270. The third plate 250 and the fourth plate 270 may be disposed to face each other. The third plate 250 may be disposed to be spaced a predetermined distance from the fourth plate 270. The third plate 250 may be coupled to the first plate 210 and the second plate 230. The fourth plate 270 may be coupled to the first plate 210 and the second plate 230. The first plate 210, the second plate 230, the third plate 250, and the fourth plate 270 may be coupled to form the inner space. The third plate 250 and the fourth plate 270 may be coupled to the first plate 210 and the second plate 230 after the thermoelectric conversion part 100 is inserted into the first holes 211 and 231 of the first plate 210 and the second plate 230.

The guide member 300 may be coupled to the chamber 200. The guide member 300 may be coupled to a second hole 212 formed in the first plate of the chamber 200. The guide member 300 may be disposed on an upper portion of one surface of one side of the thermoelectric conversion part 100.

The guide member 300 may include a case 310 and a cover 350. An inner space for accommodating a molding member may be formed in the case 310. An upper surface of the case 310 may be open. A wire hole through which a wire extending from the thermoelectric conversion part 100 passes may be formed in a lower surface of the case 310. A pipe may be disposed on one side surface of the case 310. The pipe may be inserted into the second hole 212 formed in the first plate. The wire passing through the wire hole may pass through an inner portion of the pipe. The cover 350 may be disposed on the upper surface of the case 310. The cover 350 may be coupled to the upper surface of the case 310 after the inner space of the case 310 is filled with the molding member.

The channel cover 500 may be disposed on an outer side surface of the chamber 200. The channel cover 500 may be disposed on an outer side surface of the first plate of the chamber 200. A groove in which the pipe of the guide member 300 may be disposed may be formed at one side of the channel cover 500.

The wire tube 400 may be disposed between the guide member 300 and the junction box 600. The wire passing through the pipe of the guide member 300 may pass through an inner portion of the wire tube 400. The wire passing through the wire tube 400 may be connected to the junction box 600.

The junction box 600 may be disposed on one surface of the channel cover 500. The junction box 600 may be disposed on an outer side surface of the channel cover. The junction box 600 may be connected to the wire passing through the tube. The junction box 600 may be electrically connected to the thermoelectric module of the thermoelectric conversion part 100 through the wire.

FIG. 3 is a perspective view illustrating a thermoelectric conversion part according to one embodiment of the present invention, and FIG. 4 is an exploded perspective view illustrating the thermoelectric conversion part according to one embodiment of the present invention. FIG. 5 is a conceptual view illustrating a thermoelectric element according to one embodiment of the present invention, and FIG. 6 is a conceptual view illustrating a layout of the thermoelectric element according to one embodiment of the present invention.

Referring to FIGS. 3 and 4, a thermoelectric conversion part 100 includes a duct 110 and a thermoelectric module 120 disposed on a surface of the duct 110. Although not illustrated in the drawings, the plurality of thermoelectric conversion parts 100 may also be disposed to be spaced a predetermined distance from each other in parallel to form a power generation system.

The thermoelectric conversion part 100 according to the embodiment of the present invention may generate power using a difference in temperature between a first fluid flowing through an inner portion of the duct 110 and a second fluid passing through an outer portion of the duct 110.

The first fluid introduced into the duct 110 may be water but is not limited thereto and may be any type fluid having a cooling function. A temperature of the first fluid introduced into the duct 110 may be less than 100° C., preferably 50° C., and more preferably 40° C. but is not limited thereto. A temperature of the first fluid, which passes through the duct 110 and is discharged, may be higher than a temperature of the first fluid introduced into the duct 110.

The first fluid is introduced through the fluid inlet of the duct 110 and discharged through the fluid outlet. An inlet flange (not shown) and an outlet flange (not shown) may be further disposed at a side of the fluid inlet and a side of the fluid outlet of the duct 110, respectively, in order to easily receive and discharge the first fluid and support the duct 110. Alternatively, a plurality of fluid inlets (not shown) may be formed in a first surface 111, a second surface 112 opposite to the first surface 111, and a fifth surface 115 disposed perpendicular to a third surface 113 disposed between the first surface 111 and the second surface 112 of the duct 110, and a plurality of fluid outlets 116-2 may be formed in a sixth surface 116 opposite to the fifth surface 115. The plurality of fluid inlets (not shown) and the plurality of fluid outlets 116-2 may be connected to the plurality of fluid passage pipes (not shown) in the duct 110. Accordingly, the first fluid introduced through the fluid inlets may pass through the fluid passage pipes and may be discharged from the fluid outlets 116-2.

However, this is exemplary, and the number, positions, shapes, and the like of the fluid inlets and the fluid outlets are not limited thereto. In the duct 110, one fluid inlet, one fluid outlet, and the fluid passage pipe connecting the one fluid inlet and the one fluid outlet may also be formed.

Meanwhile, the second fluid passes through the outer portion of the duct 110, for example, a heatsink 122 of the thermoelectric module 120 disposed outside the duct 110. The second fluid may be waste heat generated by an engine of a vehicle, a vessel, or the like but is not limited thereto. For example, a temperature of the second fluid may be higher than or equal to 100° C., preferably 200° C., and more preferably 220° C. to 250° C. but is not limited thereto.

In the present specification, an example, in which a temperature of the first fluid flowing through the inner portion of the duct 110 is lower than a temperature of the second fluid passing through the heatsink 122 of the thermoelectric module 120 disposed outside the duct 110, will be described. Accordingly, in the present specification, the duct 110 may be referred to as a cooling part. However, the embodiment of the present invention is not limited thereto, and the temperature of the first fluid flowing through the inner portion of the duct 110 may also be higher than the temperature of the second fluid passing through the heatsink 122 of the thermoelectric module 120 disposed outside the duct 110.

According to the embodiment of the present invention, the thermoelectric module 120 includes a thermoelectric element 121 and the heatsink 122 disposed on the thermoelectric element 121. The thermoelectric element 121 according to the embodiment of the present invention may have a structure of a thermoelectric element 10 illustrated in FIGS. 5 to 6.

Referring to FIGS. 5 and 6, the thermoelectric element 10 includes a first substrate 11, first electrodes 12, P-type thermoelectric legs 13, N-type thermoelectric legs 14, second electrodes 15, and a second substrate 16.

The first electrodes 12 are disposed between the first substrate 11 and the P-type thermoelectric legs 13 and the N-type thermoelectric legs 14, and the second electrodes 15 are disposed between the second substrate 16 and the P-type thermoelectric legs 13 and the N-type thermoelectric legs 14. Accordingly, a plurality of P-type thermoelectric legs 13 and a plurality of N-type thermoelectric legs 14 are electrically connected by the first electrodes 12 and the second electrodes 15. A pair of P-type thermoelectric leg 13 and N-type thermoelectric leg 14 which are disposed between and electrically connected to the first electrodes 12 and the second electrode 15 may form a unit cell.

For example, when a voltage is applied to the first electrodes 12 and the second electrodes 15 through lead wires 18-1 and 18-2, due to the Peltier effect, the substrate through which a current flows from the P-type thermoelectric legs 13 to the N-type thermoelectric legs 14 may absorb heat to serve as a cooling part, and the substrate through which a current flows from the N-type thermoelectric legs 14 to the P-type thermoelectric legs 13 may be heated to serve as a heating part. Alternatively, when different temperatures are applied to the first electrodes 12 and the second electrodes 15, due to the Seebeck effect, electric charges may move in the P-type thermoelectric legs 13 and the N-type thermoelectric legs 14 so that electricity may also be generated.

In this case, each of the P-type thermoelectric leg 13 and the N-type thermoelectric leg 14 may be a bismuth-telluride (Bi—Te)-based thermoelectric leg mainly including Bi and Te. The P-type thermoelectric leg 13 may be a Bi—Te-based thermoelectric leg including at least one among antimony (Sb), nickel (Ni), aluminum (Al), copper (Cu), silver (Ag), lead (Pb), boron (B), gallium (Ga), Te, Bi, and indium (In). As an example, the P-type thermoelectric leg 13 may include Bi—Sb—Te at 99 to 99.999 wt % as a main material and at least one material among Ni, Al, Cu, Ag, Pb, B, Ga, and In at 0.001 to 1 wt % based on a total weight of 100 wt %. The N-type thermoelectric leg 14 may be a Bi—Te-based thermoelectric leg including at least one among Se, Ni, Al, Cu, Ag, Pb, B, Ga, Te, Bi, and In. As an example, the N-type thermoelectric leg 14 may include Bi—Se—Te at 99 to 99.999 wt % as a main material and at least one material among Ni, Al, Cu, Ag, Pb, B, Ga, and In at 0.001 to 1 wt % based on a total weight of 100 wt %.

Each of the P-type thermoelectric leg 13 and the N-type thermoelectric leg 14 may be formed in a bulk type or stack type. Generally, the bulk type P-type thermoelectric leg 13 or the bulk type N-type thermoelectric leg 14 may be formed through a process in which a thermoelectric material is thermally treated to manufacture an ingot, the ingot is ground and strained to obtain a powder for a thermoelectric leg, the powder is sintered, and the sintered powder is cut. In this case, each of the P-type thermoelectric leg 13 and the N-type thermoelectric leg 14 may be a polycrystalline thermoelectric leg. As described above, when each of the P-type thermoelectric leg 13 and the N-type thermoelectric leg 14 is the polycrystalline thermoelectric leg, the strength of each of the P-type thermoelectric leg 13 and the N-type thermoelectric leg 14 may increase. The stacked P-type thermoelectric leg 13 or the stacked N-type thermoelectric leg 14 may be formed in a process in which a paste containing a thermoelectric material is applied on base members each having a sheet shape to form unit members, and the unit members are stacked and cut.

In this case, the P-type thermoelectric leg 13 and the N-type thermoelectric leg 14 provided in the pair may have the same shape and volume or may have different shapes and volumes. For example, since electrical conduction properties of the P-type thermoelectric leg 13 and the N-type thermoelectric leg 14 are different, a height or cross-sectional area of the N-type thermoelectric leg 14 may also be different from that of the P-type thermoelectric leg 13.

In this case, the P-type thermoelectric leg 13 or the N-type thermoelectric leg 14 may have a cylindrical shape, a polygonal column shape, an elliptical column shape, or the like.

In the present specification, the thermoelectric leg may be referred to as a thermoelectric structure, a semiconductor element, a semiconductor structure, or the like.

The performance of a thermoelectric element according to one embodiment of the present invention may be expressed as a thermoelectric performance figure of merit (ZT). The thermoelectric performance figure of merit (ZT) may be expressed by Equation 1.

$$ZT = \alpha^2 \cdot \sigma \cdot T/K \qquad \text{[Equation 1]}$$

Here, α denotes the Seebeck coefficient [V/K], σ denotes electrical conductivity [S/m], and α2·σ denotes a power factor [W/mK2]. In addition, T denotes temperature, and k denotes thermal conductivity [W/mK]. k may be expressed as a·cp·ρ, wherein a denotes thermal diffusivity [cm2/S], cp denotes specific heat [J/gK], and ρ denotes density [g/cm3].

In order to obtain the thermoelectric performance figure of merit (ZT) of a thermoelectric element, a Z value (V/K) is measured using a Z meter, and the thermoelectric performance figure of merit (ZT) may be calculated using the measured Z value.

In this case, each of the first electrodes 12 disposed between the first substrate 11 and the P-type thermoelectric legs 13 and the N-type thermoelectric legs 14 and the second electrodes 15 disposed between the second substrate 16 and the P-type thermoelectric legs 13 and the N-type thermoelectric legs 14 may include at least one among Cu, Ag, Al, and Ni and may have a thickness of 0.01 mm to 0.3 mm. When the thickness of the first electrode 12 or the second electrode 15 is less than 0.01 mm, an electrode function is degraded, and thus the electrical conductivity performance may be degraded, and when the thickness is greater than 0.3 mm, a resistance increases, and thus a conduction efficiency can be lowered.

In addition, each of the first substrate 11 and the second substrate 16, which are opposite to each other, may be a metal substrate, and a thickness of the first substrate 11 and the second substrate 16 may be in the range of 0.1 mm to 1.5 mm. When the thickness of the metal substrate is less than 0.1 mm or greater than 1.5 mm, since a heat radiation property or thermal conductivity may become excessively high, the reliability of the thermoelectric element may be degraded. In addition, when each of the first substrate 11 and the second substrate 16 is the metal substrates, insulation layers 170 may be further formed between the first substrate 11 and the first electrodes 12 and between the second substrate 16 and the second electrodes 15. Each of the insulation layers 170 may include a material having a thermal conductivity of 1 to 20 W/mK. In this case, the insulation layer 170 may be a resin composition including at least one of an epoxy resin and a silicon resin and an inorganic material, a layer formed of a silicon composite including silicon and an inorganic material, or an aluminum oxide layer. In this case, the inorganic material may be at least one among an oxide, a carbide, and a nitride combined with aluminum, boron, silicon, or the like.

In this case, sizes of the first substrate 11 and the second substrate 16 may also be different. That is, a volume, a thickness, or an area of one of the first substrate 11 and the second substrate 16 may be greater than a volume, a thickness, or an area of the other. In this case, the thickness may be a thickness in a direction from first substrate 11 toward the second substrate 16, and the area may be an area in a direction perpendicular to the direction from the first substrate 11 toward the second substrate 16. Accordingly, the heat absorption or radiation performance of the thermoelectric element can be improved. Preferably, at least one of the volume, the thickness, and the area of the first substrate 11 may be greater than that of the second substrate 16. In this case, when the first substrate 11 is disposed in a high-temperature region for the Seebeck effect or applied as a heating region for the Peltier effect, or a sealing member for protecting the thermoelectric element, which will be described below, from an external environment is disposed on the first substrate 11, at least one of the volume, the thickness, and the area of the first substrate 11 may be greater than that of the second substrate 16. In this case, the area of the first substrate 11 may be formed in the range of 1.2 to 5 times the area of the second substrate 16. When the area of the first substrate 11 is smaller than 1.2 times the area of the second substrate 16, an effect of an increase in heat transfer efficiency may not be large, and when the area of the first substrate 11 is greater than 5 times the area of the second substrate 16, a heat transfer efficiency may rather be remarkably reduced, and it cannot be easy to maintain a basic shape of the thermoelectric module.

In addition, a heat radiation pattern, for example, an uneven pattern, may be formed on a surface of at least one of the first substrate 11 and the second substrate 16. Accordingly, the heat radiation performance of the thermoelectric element can be improved. When the uneven pattern is formed on a surface in contact with the P-type thermoelectric legs 13 or the N-type thermoelectric legs 14, a bonding characteristic between the thermoelectric legs and the substrate can also be improved.

Although not illustrated in the drawings, the sealing member may also be further disposed between the first substrate 11 and the second substrate 16. The sealing member may be disposed on side surfaces of the first electrodes 12, the P-type thermoelectric legs 13, the N-type thermoelectric legs 14, and the second electrodes 15 between the first substrate 11 and the second substrate 16. Accordingly, the first electrodes 12, the P-type thermoelectric legs 13, the N-type thermoelectric legs 14, and the second electrodes 15 can be sealed from external moisture, heat, contamination, or the like.

Referring to FIGS. 3 and 4 again, the thermoelectric module 120 according to the embodiment of the present invention includes the thermoelectric element 121 and the heatsink 122 disposed on the thermoelectric element 121. In FIGS. 3 and 4, it is illustrated that two thermoelectric modules 120-1 and 120-2 are disposed on the first surface 111 of the duct 110, and two thermoelectric modules 120-3 and 120-4 are also disposed on the second surface 112, but the present invention is not limited thereto, and two or more thermoelectric modules may be disposed on one surface.

As described above, each of the thermoelectric elements 121 includes the first substrate 11 disposed to be in contact with the surface of the duct 110, the plurality of first electrodes 12 disposed on the first substrate 11, the plurality of thermoelectric legs 13 and 14 disposed on the plurality of first electrodes 12, the plurality of second electrodes 15 disposed on the plurality of thermoelectric legs 13 and 14, and the second substrate 16 disposed on the plurality of second electrodes 15, and the heatsink 122 is disposed on the second substrate 16. In addition, the insulation layers 17 may be further disposed between the first substrate 11 and the plurality of first electrodes 12 and between the plurality of second electrodes 15 and the second substrate 16.

In this case, the first substrate of the thermoelectric element 121 disposed on the duct 110 may be the metal substrate, and the metal substrate may be bonded to the surface of the duct 110 by a thermal interface material (TIM, not shown) or coupled to the surface of the duct 110 by a separate fastening member. In this case, the metal substrate may be one among a copper substrate, an aluminum substrate, and a copper-aluminum substrate but is not limited thereto.

As described above, according to the embodiment of the present invention, a plurality of thermoelectric modules 120 are disposed on the surface of the duct 110. According to the embodiment of the present invention, it is intended to maintain a uniform bonding force between the thermoelectric module 120 and the duct 110 using a supporting part.

Hereinafter, a structure of the guide member will be described in detail with reference FIGS. 7 to 14.

FIG. 7 is an exploded perspective view illustrating the guide member according to the embodiment of the present invention. FIG. 8 is a plan view illustrating the case and the pipe according to the embodiment of the present invention. FIG. 9 is a rear view illustrating the case and the pipe according to the embodiment of the present invention. FIG. 10 is a side view illustrating the case and the pipe according to the embodiment of the present invention. FIG. 11 is a plan view illustrating the cover according to the embodiment of the present invention. FIG. 12 is a front view illustrating the cover according to the embodiment of the present invention.

As illustrated in FIG. 7, the guide member 300 according to the embodiment of the present invention may include the case 310, a pipe 330, the cover 350, and a molding member 370. The guide member 300 may be formed by sequentially stacking the case 310, the molding member 370, and the cover 350.

Referring to FIGS. 7 to 10, the case 310 may include a first sidewall 311, a second sidewall 312, a third sidewall 313, a fourth sidewall 314, and a bottom plate 315.

The bottom plate 315 may have a quadrangular shape. Each of the first sidewall 311, the second sidewall 312, the third sidewall 313, and the fourth sidewall 314 may be disposed on an edge portion of the bottom plate 315. Accordingly, an accommodation space may be disposed in the case 310. In the case 310, since there may be no top plate opposite to the bottom plate 315, one surface of the case 310 may be open. The molding member 370 may be disposed in the accommodation space of the case 310.

The bottom plate 315 may include a wire hole 315-1. The wire hole 315-1 may be provided as a plurality of wire holes 315-1. The plurality of wire holes 315-1 may be disposed to be spaced apart from each other. The wire hole 315-1 may be disposed at one side of a lower surface of the case 310. The wire hole 315-1 may be disposed close to the second sidewall 312. The wire hole 315-1 may be disposed to correspond to the thermoelectric conversion part disposed in the chamber.

The first sidewall 311 may be disposed on a first edge of the bottom plate 315. The first sidewall 311 may have a first height h1. The first height h1 may be greater than a second height h2 of the second sidewall 312. The first sidewall 311 may include a screw hole 311-2 and a through-hole 311-1.

The through-hole 311-1 may be provided as a plurality of through-holes 311-1. The plurality of through-holes 311-1 may be disposed to be spaced a predetermined distance from each other. The through-hole 311-1 may communicate with the pipe 330 disposed outside the first sidewall 311. The pipe 330 may include a first opening open1 and a second opening open2, and the through-hole 311-1 may communicate with the second opening open2 of the pipe 330. A width of the through-hole 311-1 may be the same as a width of the second opening open2 of the pipe 330.

The screw hole 311-2 may be provided as a plurality of screw holes 311-2. The plurality of screw holes 311-2 may be disposed to be spaced a predetermined distance from each other. The screw hole 311-2 may be formed at a higher position than the second height h2 in the first sidewall 311. Accordingly, screw fastening using the screw hole 311-2 can be easily performed, and assembly convenience of the power generation apparatus can be improved.

The second sidewall 312 may be disposed on a second edge of the bottom plate 315. The second edge of the bottom plate 315 may be opposite to the first edge of the bottom plate 315. Accordingly, the second sidewall 312 may be disposed opposite to the first sidewall 311. The second sidewall 312 may have the second height h2. The height of the second sidewall 312 may be less than the height of the first sidewall 311.

The third sidewall 313 may be disposed on a third edge of the bottom plate 315. The third edge of the bottom plate 315 may be disposed between the first edge and the second edge of the bottom plate 315. Accordingly, the third sidewall 313 may be disposed between the first sidewall 311 and the second sidewall 312. The third sidewall 313 may have the second height h2. The height of the third sidewall 313 may be the same as the height of the second sidewall 312.

The fourth sidewall 314 may be disposed on a fourth edge of the bottom plate 315. The fourth edge of the bottom plate 315 may be disposed between the first edge and the second edge of the bottom plate 315. The fourth edge of the bottom plate 315 may be opposite to the third edge of the bottom plate 315. Accordingly, the third sidewall 313 may be disposed between the first sidewall 311 and the second sidewall 312. The fourth sidewall 314 may be disposed opposite to the third sidewall 313. The second sidewall 312 may have the second height h2. A height of the fourth sidewall 314 may be the same as the height of the second sidewall 312. The height of the fourth sidewall 314 may be the same as the height of the third sidewall 313.

The case 310 may include supporting members 316-1 and 316-2. The supporting members 316-1 and 316-2 may be provided as a plurality of supporting members 316-1 and 316-2. According to one embodiment, the number of the supporting members 316-1 and 316-2 is two but is not limit thereto. The first supporting member 316-1 may be disposed close to the third sidewall 313, and the second supporting member 316-2 may be disposed close to the fourth sidewall 314. A height of each of the supporting members 316-1 and 316-2 may be less than the second height h2.

Referring to FIGS. 7, 11, and 12, the cover 350 may include a main body 352 and a protruding part 354. The main body 352 may have a quadrangular shape. The protruding part 354 may be disposed at one side of the main body 352. The protruding part 354 may be disposed at one side close to the first sidewall 311 of the case 310 on the one side of the main body 352. The protruding part 354 may be provided as a plurality of protruding parts 354. The number of the protruding parts 354 may be the same as the number of the through-holes 311-1. The number of the protruding parts 354 may be the same as the number of the pipes 330. The protruding part 354 may be disposed toward an upper surface of the main body 352. A shape of the protruding part 354 may be the same as a shape of a part of the through-hole 311-1. For example, when the through-hole 311-1 has a circular shape, the protruding part 354 may have a semicircular shape. A space may be formed inside the protruding part 354. For example, a semicircular space may be formed inside the protruding part 354.

FIG. 13 is a perspective view illustrating the assembled guide member according to the embodiment of the present invention. FIG. 14 is a cross-sectional view illustrating the guide member according to the embodiment of the present invention.

FIG. 13 is the perspective view illustrating the guide member 300 in which the case 310, the pipe 330, the cover 350, and the molding member 370 are coupled. FIG. 14 is the cross-sectional view illustrating the guide member 300 of FIG. 13 along line A-A'.

Referring to FIGS. 13 and 14, the molding member 370 may be disposed in the accommodation space in the case 310. The molding member 370 may be formed by arranging a resin having fluidity in the accommodation space of the case 310 and curing the resin. After the molding member 370 is disposed in the accommodation space of the case 310, the cover 350 may be coupled to an upper surface of the molding member 370. After the molding member 370 is disposed in the accommodation space of the case 310, the cover 350 may be coupled to the upper surface of the case 310. Accordingly, the molding member 370 may not be exposed to the outside of the guide member 300. As the molding member 370 is disposed in the accommodation space of the case 310, the molding member 370 may cover the wire hole. When there is no molding member 370, the inner space of the chamber may communicate with the outside of the power generation apparatus through the wire hole, the accommodation space of the case 310, and the pipe 330. In this case, foreign materials (dust, moisture, water, and the like) may be introduced into the inner space of the chamber from the outside of the power generation apparatus. In addition, high-temperature gas in the power generation apparatus may leak to the outside of the power generation apparatus. However, in the guide member 300 according to the embodiment of the present invention, the foreign materials may be prevented from being introduced into the power generation apparatus by arranging the molding member 370 in the accommodation space of the case 310, and the high-temperature gas in the power generation apparatus may be prevented from leaking to the outside of the power generation apparatus. When the cover 350 is coupled to an upper portion of the molding member 370, the cover 350 may cover the through-hole disposed in the first sidewall of the case 310. Since the molding member 370 is not higher than the second sidewall, the molding member 370 may close only a part of the through-hole. Accordingly, a part of the through-hole may be open. However, as the protruding part of the cover 350 covers an open region of the through-hole, the foreign materials (dust, moisture, water, and like) may be prevented from being introduced into the power generation apparatus through the through-hole, and the high-temperature gas in the power generation apparatus may be prevented from leaking to the outside of the power generation apparatus.

The molding member 370 may be disposed to surround the wire disposed in the accommodation space. Accordingly, the molding member 370 may prevent the wire from shaking to improve connection safety of the power generation apparatus and protect the wire from external impacts or heat.

FIG. 15 is a perspective view illustrating a power generation module including a case and a pipe according to an embodiment of the present invention. FIG. 16 is a cross-sectional view illustrating the power generation module including the case and the pipe according to the embodiment of the present invention. FIG. 16 is the cross-sectional view illustrating the power generation module of the FIG. 15 along line A-A'.

Referring to FIGS. 15 and 16, the power generation apparatus may include a thermoelectric conversion part 100, a chamber 200, a guide member 300, a wire tube 400, a channel cover 500, and a junction box 600. The power generation apparatus may include a wire 700 and a gasket 390. The guide member 300 may include a case 310 and a pipe 330.

A part of the thermoelectric conversion part 100 may be inserted into a hole of the chamber so that the thermoelectric conversion part 100 may be coupled to the chamber. The case 310 may be disposed at one side of the chamber. The case 310 may be disposed on a plate 210 in which the hole, into which the thermoelectric conversion part 100 is inserted, is disposed at one side of the chamber.

The gasket 390 may be disposed between the case 310 and the chamber. The gasket may be disposed between the plate 210 in which the hole is disposed and a first sidewall of the case 310. The gasket 390 may be formed in a material capable of sealing between the chamber and the case 310. The gasket 390 may be formed of a rubber-based material but is not limited thereto. The gasket 390 may be formed of a material such as rubber-coated cloth, asbestos, or copper. The channel cover 500 may be disposed on an outer side surface of the chamber. The junction box 600 may be disposed on an outer side surface of the channel cover 500. The wire tube may be disposed between the case 310 and the junction box 600. After the gasket 390 is disposed between the case 310 and the chamber, the gasket 390 is fastened thereto using a screw or the like, and thus foreign materials of the outside of the power generation apparatus can be prevented from being introduced into the power generation apparatus. In addition, high-temperature gas in the power generation apparatus can be prevented from leaking to the outside of the power generation apparatus.

The wire 700 may be connected to the thermoelectric conversion part 100. The wire 700 may be withdrawn from an upper surface, which is close to a region inserted into the chamber, of the thermoelectric conversion part 100. According to the embodiment, two wires 700 may be withdrawn from one thermoelectric conversion part 100. The wire 700 withdrawn from the thermoelectric conversion part 100 may pass through a bottom plate of the case 310. The wire 700 withdrawn from the thermoelectric conversion part 100 may pass through a wire hole of the bottom plate. A width of the wire hole formed in the bottom plate may be greater than a width of the wire 700. Accordingly, even when the wire 700 passes through the wire hole, a part of the wire hole may be open. The wire 700 passing through the wire hole of the bottom plate may pass through a through-hole formed in the first side plate of the case 310. The wire 700 passing through the through-hole formed in the first side plate may pass through the pipe 330 communicating with the through-hole. The wire 700 passing through the through-hole and the pipe 330 may be provided as a plurality of wires 700. As an example, two wires 700 withdrawn from one thermoelectric conversion part 100 may pass through the same through-hole and the same pipe 330. As an example, the plurality of wires 700 withdrawn from the adjacent plurality of thermoelectric conversion parts 100 may pass through the same through-hole and the same pipe 330.

The wire 700 passing through the through-hole and the pipe 330 may pass through the wire tube 400. After the plurality of wires 700 withdrawn from the thermoelectric conversion parts 100 of which the number is predetermined pass through the same through-hole and the same pipe 330, the plurality of wires 700 may pass through the same wire tube 400. The tube of the wire 700 may not only protect a plurality of electric wires disposed therein from an external impact or environment but also improve assembly convenience. The wire 700 passing through the wire tube 400 may be connected to the junction box 600. The wire 700 passing through the wire tube 400 may be connected to an electrical circuit in the junction box 600.

FIG. 17 is a perspective view illustrating a power generation module including a case and a molding member according to an embodiment of the present invention. FIG. 18 is a cross-sectional view illustrating the power generation module including the case and the molding member according to the embodiment of the present invention. FIG. 18 is the cross-sectional view illustrating the power generation module of FIG. 17 along line A-A'.

Referring to FIGS. 17 and 18, the power generation apparatus may include a thermoelectric conversion part 100, a chamber 200, a guide member 300, a wire tube 400, a channel cover 500, and a junction box 600. The power generation apparatus may include a wire 700 and a gasket 390. The guide member 300 may include a case 310, a pipe 330, and a molding member 370.

Like the description with reference to FIGS. 15 and 16, the case 310 may be disposed inside the chamber and an upper surface of the thermoelectric conversion part 100. The wire 700 withdrawn from the thermoelectric conversion part 100 may pass through a wire hole and a through-hole of the case 310 and the wire tube 400 and may be connected to the junction box 600.

In a state in which the wire 700 is disposed, the molding member 370 may be disposed in an accommodation space of the case 310. As the molding member 370 is disposed in the accommodation space of the case 310, the molding member 370 may block a gap between the wire hole formed in a bottom plate and the wire 700. The molding member 370 may be disposed in the accommodation space of the case 310 up to a height of a second sidewall. According to one embodiment, the molding member 370 may be disposed so that the wire 700 is not exposed in the accommodation space of the case 310. As the molding member 370 is disposed so that the wire 700 is not exposed in the accommodation space of the case 310, the wire may be protected from heat in the power generation apparatus and vibrations of the power generation apparatus. The molding member 370 may be formed of a material including an epoxy-based, silicone-based resin composite, or the like. Meanwhile, since the molding member 370 may be disposed to the maximum level of the second sidewall, at least a part of the through-hole of the case 310 may be open.

FIG. 19 is a perspective view illustrating a power generation module including a case, a pipe, a molding member, and a cover according to an embodiment of the present invention. FIG. 20 is a cross-sectional view illustrating the power generation module including the case, the pipe, the molding member, and the cover according to the embodiment of the present invention. FIG. 20 is the cross-sectional view illustrating the power generation module of FIG. 19 along line A-A'

Referring to FIGS. 19 and 20, the power generation apparatus may include a thermoelectric conversion part 100, a chamber 200, a guide member 300, a wire tube 400, a channel cover 500, and a junction box 600. The power generation apparatus may include a wire 700 and a gasket 390. The guide member 300 may include a case 310, a pipe 330, a molding member 370, and a cover 350.

Like the description with reference to FIGS. 15 to 18, the case 310 may be disposed inside the chamber and an upper surface of the thermoelectric conversion part 100. The wire 700 withdrawn from the thermoelectric conversion part 100 may pass through a wire hole and a through-hole of the case 310 and the wire tube 400 and may be connected to the junction box 600. In a state in which the wire 700 is disposed, the molding member 370 may be disposed in an accommodation space of the case 310.

In a state in which the molding member 370 is disposed in the accommodation space of the case 310, the cover 350 may be disposed on the case 310. The cover 350 may be disposed on the molding member 370. A protruding part of the cover 350 may be disposed in a region, which is open without being closed by the molding member 370, of the through-hole disposed in the case. The protruding part of the cover 350 can prevent foreign materials of the outside of the power generation apparatus from being introduced into the power generation apparatus by blocking the open region of the through-hole after the molding member 370 is disposed. In addition, high-temperature gas introduced into the power generation apparatus may be prevented from leaking to the outside of the power generation apparatus.

The power generation may generate power using heat generated by a vessel, a vehicle, a power plant, or the ground, and a plurality of power generation apparatuses may be arranged in order to effectively collect the heat. In this case, in each of the power generation apparatuses, a coupling force between the thermoelectric module and the fluid flow part may be increased to improve the cooling performance of the lower-temperature part of the thermoelectric element, accordingly, an efficiency and reliability of the power generation apparatus may be improved, and thus a fuel efficiency of a transportation apparatus such as a vessel or a vehicle may be improved. Accordingly, in the shipping industry and transportation industry, transportation costs can be reduced, an eco-friendly industrial environment can be created, and when the power generation apparatus is applied to the manufacturing industry such as a steel mill, material costs and the like can be reduced.

While the present invention has been described with reference to exemplary embodiments thereof, it will be understood by those skilled in the art that the present invention may be variously changed and modified without departing from the spirit and scope of the present invention defined by the appended claims below.

The invention claimed is:
1. A power generation apparatus comprising:
a thermoelectric conversion part including a duct and a thermoelectric module disposed on one surface of the duct;
a chamber having one side surface in which a hole is formed so that one end of the thermoelectric conversion part is inserted into the hole;
a wire connected to the thermoelectric module; and
a guide member in which an accommodation space is formed to accommodate the wire,
wherein the guide member includes a case disposed close to the one side surface of the chamber and including a wire hole and a through-hole through which the wire passes, a pipe disposed outside the accommodation space of the case to correspond to the through-hole, a molding member disposed in the accommodation space, and a cover disposed on upper end of the case, and
the molding member is disposed to surround the wire.

2. The power generation apparatus of claim 1, wherein the wire is withdrawn from the thermoelectric conversion part and disposed to pass through the wire hole, the through-hole, and the pipe.

3. The power generation apparatus of claim 1, further comprising a wire tube which is disposed close to the pipe and in which the wire passing through the pipe is disposed therein,
wherein a plurality of electric wires withdrawn from thermoelectric conversion parts of which the number is predetermined are disposed in the wire tube.

4. The power generation apparatus of claim 1, wherein, in the chamber, a hole into which the other end of the thermoelectric conversion part inserted is further formed in the other side surface opposite to the one side surface.

5. The power generation apparatus of claim 4, wherein the hole of the one side surface of the chamber and the hole of the other side surface of the chamber are disposed to face each other.

6. The power generation apparatus of claim 1, wherein the case includes:
   a bottom plate;
   a first sidewall disposed on a first edge of the bottom plate; and
   a second sidewall which is opposite to the first sidewall and disposed on a second edge opposite to the first edge of the bottom plate,
   wherein the wire hole is disposed in the bottom plate, and the through-hole is disposed in the first sidewall.

7. The power generation apparatus of claim 6, further comprising a gasket disposed between the one side surface of the chamber and the first sidewall of the case.

8. The power generation apparatus of claim 6, wherein the molding member is disposed in a separation space between the wire and the wire hole.

9. The power generation apparatus of claim 8, wherein a height of the molding member is less than or equal to a height of the second sidewall.

10. The power generation apparatus of claim 6, wherein the cover includes:
    a main body; and
    a protruding part disposed at one side of the main body, wherein the protruding part is disposed to correspond to the through-hole disposed in the first sidewall.

11. The power generation apparatus of claim 10, wherein the protruding part is a semicircular shape with a space formed therein.

12. The power generation apparatus of claim 6, wherein:
    the first sidewall is disposed close to the one side surface of the chamber; and
    the bottom plate is disposed close to an upper surface of the thermoelectric conversion part.

13. The power generation apparatus of claim 12, wherein, the wire hole is disposed closer to the second sidewall than to the first sidewall.

14. The power generation apparatus of claim 12, wherein a height of the first sidewall is higher than a height of the second sidewall.

15. The power generation apparatus of claim 14, wherein a screw hole is further disposed on the first sidewall, and the screw hole is disposed at a position higher than the height of the second sidewall.

16. A power generation apparatus comprising:
    a plurality of thermoelectric conversion parts;
    a first plate having a plurality of holes through which one ends of the plurality of thermoelectric conversion parts are inserted;
    a second plate having a plurality of holes through which the other ends of the plurality of thermoelectric conversion parts are inserted;
    a plurality of wires connected to the plurality of thermoelectric conversion parts; and
    a guide member for guiding the plurality of wires,
    wherein the guide member is disposed on a top of one ends of the plurality of thermoelectric conversion parts,
    wherein a plurality of wire holes and a plurality of through holes through which the plurality of wires pass are formed in the guide member; and
    wherein the guide member includes a molding member disposed to surround the plurality of wires.

17. The power generation apparatus of claim 16,
    wherein the guide member includes a bottom plate disposed above one ends of the plurality of thermoelectric conversion parts, and a first sidewall disposed at a first edge of the bottom plate, and
    wherein the plurality of wire holes are formed in the bottom plate, and the plurality of through holes are disposed in the first sidewall.

18. The power generation apparatus of claim 17,
    wherein each of the plurality of wire holes corresponds to each of the plurality of thermoelectric conversion parts; and
    wherein the number of the plurality of through holes is less than the number of the plurality of wire holes.

19. The power generation apparatus of claim 17,
    wherein the guide member further includes a second sidewall opposite to the first sidewall and disposed at a second edge opposite to the first edge of the bottom plate; and
    wherein the plurality of wire holes are disposed closer to the second sidewall than to the first sidewall.

20. The power generation apparatus of claim 16,
    wherein the plurality of holes formed in the first plate and the plurality of holes formed in the second plate are disposed to face each other.

* * * * *